United States Patent [19]

Egawa et al.

[11] Patent Number: 5,501,746
[45] Date of Patent: Mar. 26, 1996

[54] PROCESS FOR PREPARING SUPERCONDUCTING WIRE

[75] Inventors: Kunihiko Egawa; Yoshio Kubo; Takayuki Nagai; Fusaoki Uchikawa; Shoji Miyashita; Hiroko Higuma, all of Amagasaki, Japan

[73] Assignee: Mitsubishi Denki Kabusuhiki Kaisha, Tokyo, Japan

[21] Appl. No.: 380,723

[22] Filed: Jan. 30, 1995

Related U.S. Application Data

[63] Continuation-in-part of Ser. No. 167,061, Dec. 16, 1993.

[51] Int. Cl.⁶ ........................................................ C22F 1/16
[52] U.S. Cl. ................................................... 148/98; 29/599
[58] Field of Search ............................. 148/96, 98; 29/599

[56] References Cited

U.S. PATENT DOCUMENTS

| | | | |
|---|---|---|---|
| 3,905,839 | 9/1975 | Hashimoto | 29/599 |
| 4,002,504 | 1/1977 | Howe | 148/98 |
| 4,148,129 | 4/1979 | Young | 29/599 |
| 4,973,365 | 11/1990 | Ozeryansky et al. | 29/599 |

FOREIGN PATENT DOCUMENTS

| | | | |
|---|---|---|---|
| 54-22758 | 8/1979 | Japan . | |
| 61-16141 | 4/1986 | Japan . | |
| 6-139847 | 5/1994 | Japan | 29/599 |
| WO91/04583 | 4/1991 | WIPO . | |

OTHER PUBLICATIONS

S. Miyashita et al., "Effects of the Titanium Addition to the NB₃Sn Wires Fabricated by the Internal Tin Diffusion Process", *IEEE Transactions on Magnetics*, vol. Mag–23, No. 2, Mar. 1987, pp. 629–632.

E. Gregory et al., "Improvement of the Structure and Properties of Internal Tin Nb₃Sn Conductors", *Advances in Cryogenic Engineering*, vol. 38, pp. 579–586.

E. Gregory et al., "The Development of an Internal–Tin Nb₃Sn Strand for Fusion Applications", *Proceedings of the 17th Symposium on Fusion Technology*, Rome, Italy, Sep. 18, 1992.

Y. Kubo et al., "Transactions of the Meeting", *49th Meeting on Cryogenics and Superconductivity*, May 19–21, 1993, p. 187.

*Patent Abstracts of Japan*, vol. 013, No. 005 (E–701), Jan. 9, 1989, JP 63216212.

*Patent Abstracts of Japan*, vol. 017, No. 097 (E–1326), Feb. 25, 1993, JP 4289615.

*Primary Examiner*—John Sheehan
*Attorney, Agent, or Firm*—Burns, Doane, Swecker & Mathis

[57] ABSTRACT

A process for preparing a superconducting wire having improved superconducting characteristics in shortened period of time at a reduced cost, which comprises the steps of forming a plurality of holes in each of Cu base metal plates, stuffing the plates in a supporting container to form a stacked body of the plates with their holes aligned with each other, stuffing a superconductor or a material convertible into a superconductor by a heat treatment into the resulting through-holes of the stacked body, evacuating and sealing the supporting container to form a composite billet, and processing the composite billet in a usual manner to give a superconducting wire.

20 Claims, 6 Drawing Sheets

5,501,746

PROCESS FOR PREPARING SUPERCONDUCTING WIRE

This application is a continuation-in-part of application Ser. No. 08/167,061, filed Dec. 16, 1993.

BACKGROUND OF THE INVENTION

The present invention relates to a process for preparing a superconducting wire, and more particularly to a process for preparing a superconducting wire by using a composite billet wherein a superconductor or a material convertible into a superconductor by a heat treatment is filled in each of holes of a body having a multiplicity of holes composed of built-up Cu base metal plates stuffed in a supporting container.

As the field of application of superconducting materials which can allow to flow a heavy current or can generate a strong magnetic field, there are mentioned, for example, (1) development of energy saving technology by utilization of superconducting materials in electrical power systems such as generator, power transmission cable and energy storage, (2) development of new energy such as nuclear fusion or MHD power generation, and (3) development of new technology utilizing high magnetic field such as high energy accelerator, linear motor car, electromagnetic thrust ship, magnetic separation and medical MRI. Development of excellent technology for superconducting wire material is indispensable to growth or advance of application technology for superconducting materials. There have hitherto been developed NbTi alloy superconducting wire for application under a magnetic field of not more than 8 T and 9 T and $Nb_3Sn$ and $V_3Ga$ compound superconducting wires for application under a magnetic field of not less than 8 T and 9 T. These superconducting wires have, for stabilization thereof, a structure that a multiplicity of superconducting filaments having a diameter of several tens of micrometers or less are embedded in a metal matrix having a low electrical resistivity such as Cu and the filaments are twisted. Such superconducting wires are called fine multifilamentary wire.

Practical application of the fine multifilamentary wires started with an alloy type material having a good processability. A process for preparing an NbTi wire is briefly explained below. The details thereof are described in various publications, for example, Superconductive Engineering (Revised Edition) published by Kabushiki Kaisha Ohm-She, page 74, (1988), and Zairyokagakushi, Vol. 20, page 80 (1983).

First, NbTi alloy is subjected to cold working to form a round rod. The round rod is inserted into a Cu tube, and the resultant is processed to reduce the cross-sectional area, typically drawn to a small size, to form a single core wire. The single core wire is then cut into pieces having an appropriate length and a plurality of these wire pieces are stuffed into a container made of Cu. Air in the container is evacuated, and a cover is welded to the container to seal it up, thus giving a composite billet. Thereafter the composite billet is repeatedly subjected to an extrusion processing and the sectional area reduction processing to give a composite wire. When it is desired to produce a superconducting wire having a heavy current capacity, a multiplicity of the thus obtained composite wires may be stuffed into a Cu tube and drawn to reduce the sectional area. In general, the critical current density of NbTi alloy wire is greatly increased by combination of a high reduction processing (rate of sectional area reduction of not less than $10^4$) and annealing (heat treatment temperature of 350° to 450° C.). Therefore, the composite wire is usually subjected to repeated high reduction processing-annealing, and further to twisting processing to give a fine multifilamentary wire.

With respect to a process for preparing compound superconducting wires, an explanation is given below. The compound superconducting materials have an excellent feature that the critical temperature (Tc) and the upper critical magnetic field ($Bc_2$) both are fairly high as compared with the alloy superconducting materials. On the other hand, they have the disadvantage of being very fragile. Therefore, since the compound superconducting materials themselves have no processability, various proposals have been made with respect to a process for the production of fine multifilamentary wires of these materials. The processes industrially established at present are those utilizing a solid phase reaction. The principal processes are a bronze process, a tube process, an internal tin diffusion process, an external tin diffusion process and the like, as known, for example, from Superconductive Engineering (Revised Edition) published by Kabushiki Kaisha Ohm-Sha, page 74 (1988) and Zairyo-okagakushi, Vol. 20, page 82 (1983). A typical internal tin diffusion process will be briefly explained below with reference to $Nb_3Sn$, since $V_3Ga$ is qualitatively equivalent to $Nb_3Sn$ if V is substituted for Nb and Ga is substituted for Sn.

First, an Nb rod is inserted into a Cu tube and processed to reduce the area in section to a certain diameter thereby giving a single core wire. The single core wire is cut into pieces having an appropriate length. A multiplicity of these wire pieces are stuffed into a container made of Cu, while a Cu rod or a bundle of Cu wires is disposed in the center portion of the container. Air in the container is evacuated, and a cover is welded to the container to seal up it, thus giving a composite billet. Then, the composite billet is subjected to extrusion processing, and a hole is drilled mechanically in the Cu portion in the center of the composite billet. An Sn rod is inserted into the hole, and the composite billet is circumferentially covered with a tube made of Ta or Nb, and further with a Cu tube. The resultant is processed to reduce the cross-sectional area. If it is desired to produce a superconducting wire having a heavy current capacity, a multiplicity of the thus obtained composite wires may be further stuffed into a Cu tube and drawn to reduce the sectional area. After drawing the thus obtained composite wire to a final diameter and subjecting to a twisting processing, it is subjected to a heat treatment, whereby Sn is diffused into the surrounding Cu to convert Cu into a Cu-Sn compound or alloy, and further to react with the Nb filaments to convert the surface region or the entire of the Nb filaments into $Nb_3Sn$, thus giving an $Nb_3Sn$ fine multifilamentary wire.

Like this, a process for the preparation of a fine multifilamentary wire is being industrially established with respect to both an alloy superconductor and a compound superconductor. Recently, a high field magnet of not less than 17 T is put to practical use by adding a third element to an $Nb_3Sn$ compound.

However, these conventional processes have disadvantages. A step of stuffing a multiplicity of Cu rods or wires or Cu/NbTi or Cu/Nb single core wires into a Cu container to produce a composite billet is the most important in the production of superconducting wires. Since the shape or structure of the fine multifilamentary wire is almost determined by this step, it may be safely be said that the good and bad of the result of this step governs the superconducting characteristics of the obtained wires. In conventional processes explained above, the composite billet has been prepared by inserting from several tens to one thousand several hundreds of the single core wires cut to an appropriate length into a Cu tube by means of many hands. Therefore, it requires much labor and time in order to satisfy the processing accuracy such as linearity of the single core wire, thus resulting in increase of preparation cost. Further, the conventional processes have a limit in packing density of the single core wires.

Also, hereafter, in order to meet the demand for further improved high performance of superconducting wires, it would be an important subject to further increase the number of superconducting filaments and to make the filament thinner. For achieving this subject, it is necessary to increase the number of single core wires packed in a Cu container in the preparation of the composite billet, or to repeat the procedure of composite billet formation in many times. Therefore, a good processability is desired, and the above-mentioned processes have a limit in this point. Further, increase in the number of filaments means that the distance between the superconducting filaments in the fine multifilamentary wire becomes shorter than in a conventional one. As a result, a physical coupling of filaments or a superconductive coupling owing to proximity effect will occur in a part or most part of the superconducting filaments to increase alternate current loss, typically hysteresis loss, resulting in deteriorating characteristics. Therefore, if a simple method other than stuffing single core wires into a Cu tube could be adopted in the preparation of the composite billet, not only simplification and cost reduction of the preparation process would be achieved, but also the superconducting characteristics would be improved.

An improved process for preparing a composite billet is proposed in Japanese Patent Publication Kokoku No. 54-22758 and U.S. Pat. No. 4,973,365. In the process proposed in the Japanese publication, a plurality of copper blocks each having a plurality of holes drilled in the longitudinal direction are stacked, superconducting material rods are inserted into the holes, copper covers are applied to both ends of the stacked blocks, and the periphery of the stacked blocks and covers are welded at their contacting portions in a vacuum by electron beams to form a billet to be extruded. U.S. Pat. No. 4,973,365 discloses a process for preparing a billet for extrusion by drilling a plurality of holes in a copper rod covered with a copper stabilizing layer and an Sn diffusion barrier layer and inserting Nb rods into the holes.

However, the former process has the problems that electron beam welding must be conducted in a vacuum in many times, thus the process steps become complicated to increase the preparation cost, and that the depth of weld penetration at the contact surface between the respective copper blocks is only 2 mm, so breaking of wire frequently occurs at the time of the sectional area reduction processing conducted thereafter. Also, the latter process has the problems that in practice it is difficult to drill a multiplicity of holes in a copper rod and it is impossible to secure a copper rod length of more than several meters.

It is an object of the present invention to solve the above-mentioned problems and to provide a process for preparing a superconducting wire having improved superconducting characteristics, which can achieve shortening of the preparation time and reduction of the preparation cost.

A further object of the present invention is to provide a process for preparing a superconducting wire which can be practiced with an improved processability or workability to improve the yield in a shortened period of time at a reduced preparation cost.

A still further object of the present invention is to provide a process for preparing a superconducting wire according to which alloy superconducting wires and compounds superconductive wires having improved superconducting characteristics can be easily prepared in a simple manner.

These and other objects of the present invention will become apparent from the description hereinafter.

SUMMARY OF THE INVENTION

In accordance with the present invention, there is provided a process for preparing a superconducting wire which comprises the steps of making a plurality of holes in each of Cu base metal plates, placing said plates in a supporting container in a stacked fashion so that the holes in said plates are aligned with each other to form through-holes in the resulting stacked body, stuffing a material convertible into a superconductor by a heat treatment into said through-holes of the stacked body, evacuating and sealing said supporting container to form a composite billet, processing said composite billet to reduce its sectional area, and heat-treating the processed composite billet to convert said convertible material into a superconductor.

The composite billet may be subjected to a hot pressing treatment, e.g. a hot isostatic pressing treatment, prior to subjecting to the section reducing processing such as extrusion or drawing processing. Since the adhesion between the supporting container, stacked plates and the stuffed material is improved by this treatment, the processability of the composite billet at the time of sectional area reduction processing is further improved. That is to say, the degree of processing at the time of the area reduction processing of the composite billet can be set within an increased range. Further, breaking of wire during the processing can be prevented with achievement of shortening in preparation time, thus the yield is improved and the preparation cost is further reduced.

After subjecting the composite billet to a sectional area reduction processing to an appropriate diameter, the supporting container portion may be chemically removed without causing a chemical reaction with the Cu base metal plates. When the supporting container is made of Fe or Ni, hydrochloric acid is suitable as the treating agent for this purpose, and the supporting container can be easily removed by immersing the composite billet in hydrochloric acid. Since the container is removed, the current density of the obtained wire is increased to improve the characteristics. Since the supporting container is removed by a chemical means, this step is simple. Thus, a superconducting wire having further improved characteristics can be prepared with simplified procedures, shortened time and reduced cost.

The process of the present invention can be practiced by using a superconductor instead of a material convertible into a superconductor by heat treatment. Accordingly, in another aspect, the present invention provides a process for preparing a superconducting wire which comprises the steps of making a plurality of holes in each of Cu base metal plates, placing said plates in a supporting container in a stacked fashion so that the holes in said plates are aligned with each other to form through-holes in the resulting stacked body, stuffing a superconductor into said through-holes of the stacked body, evacuating and sealing said supporting container to form a composite billet, and processing said composite billet to reduce its sectional area.

In this process, too, as mentioned above the composite billet may be subjected to a hot isostatic pressing treatment prior to the sectional area reduction processing, and the supporting container may be chemically removed from the composite billet, after subjecting the composite billet to the sectional area reduction processing, by a chemical treatment with a treating agent such as an acid capable of dissolving the metal of the container but incapable of chemically reacting with the Cu base metal plates.

According to the present invention, the preparation of a composite billet is made easily and simply. Moreover, superconducting wires can be prepared by adopting conventional steps or processes for the wire production with alteration of only process for the preparation of a composite billet. Thus, it is possible to achieve shortening of production time and reduction of production cost and, moreover, to utilize conventional equipments and installations for the wire production. Further, since holes for stuffing a superconductor or a material convertible thereto can be drilled arbitrarily in the metal plates in the present invention, the degree of freedom for designing the composite billet is remarkably increased, whereas in a conventional process how to stuff is limited owing to the shape of the hexagonal bar or rod used. Therefore, it is possible to produce a composite billet having an optimum design. For the reasons that a composite billet having an optimum design can be used in the production of superconducting wires and that a change in sectional shape or structure of the composite billet owing to processing is suppressed, it is possible to prepare a superconducting wire which has improved superconducting characteristics as compared with conventional wires.

DETAILED DESCRIPTION

Figure 1:
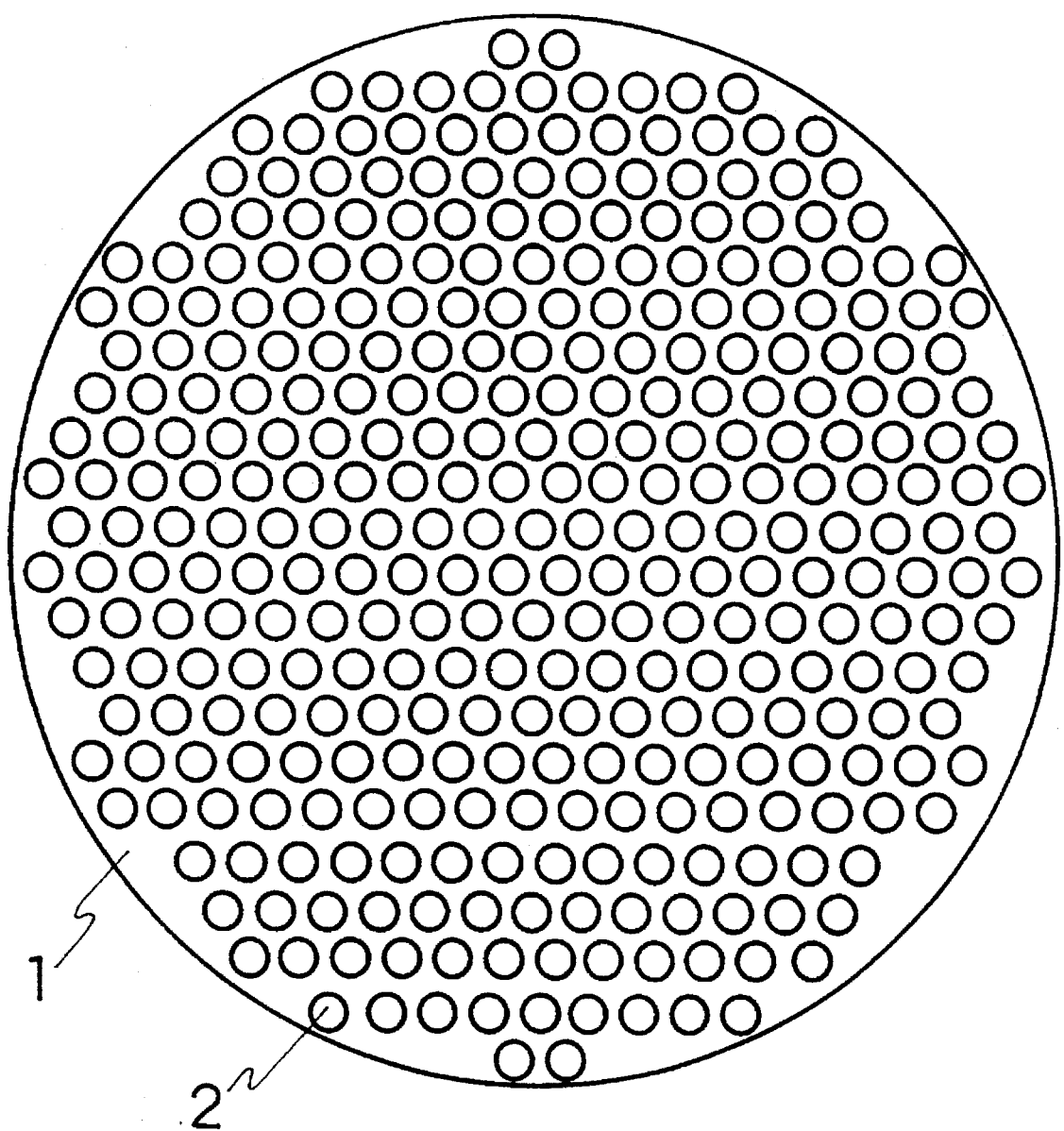
FIG. 1 is a plan view of a Cu base metal plate in which holes are drilled, related to an embodiment of the present invention.

The term "X base metal" as used herein means a metal composed mainly of a metal X, which may either be a pure metal X or contain an additive. The X base metal may be in the form of an alloy or intermetallic compound of a metal X as a base metal with other metals.

The process of the present invention is applicable to production of any of known superconducting wires, such as NbTi alloy superconducting wires, $Nb_3Sn$ compound superconducting wires, $V_3Ga$ compound superconducting wires, and other compound type wires.

The material convertible into a superconductor by a heat treatment is well known in the art, e.g. an Nb base metal such as Nb used in combination with an Sn base metal such as Sn, and a V base metal such as V used in combination with a Ga base metal such as Ga.

In the present invention, at least one element selected from Ti, In, Ge, Si, Al, Ta, Hf, Zr, W and Mo, or an alloy containing at least one of these elements, may be added to at least one of the Cu base metal, the Nb or V base metal and the Sn or Ga base metal, whereby the critical current density Jc may be improved.

Examples of the metal of the Cu base metal plate used in the present invention are pure Cu and alloys of Cu as a base metal with at least one metal selected from the group consisting of Sn, Ga, Ti, In, Ge, Si and Al.

A multiplicity of holes are formed in the Cu base metal plate. The shape and size of the Cu base metal plate, the number of holes and the shape and size of the hole are not particularly restricted, and are suitably determined according to the desired wire design and the like. The Cu base metal plate in the form of disk is usually employed. It is possible to provide about 5 to 1,500 or more holes having a diameter of not less than about 1 mm in the Cu base metal plate. The drilling of the Cu base metal plate can be carried out in a known manner. For example, the plate is drilled by using an NC drilling machine. In that case, the thickness of the Cu base metal plate is usually from 5 to 50 mm, especially 5 to 30 mm, more especially 5 to 20 mm.

If the thickness of the plate is thin, for example, about 1 mm or less, the holes can be easily formed by punching. In case of mass-producing wires having the same specification, drilling by means of punching is desirable in processing accuracy and shortening of processing time. From the viewpoint of the punching processing for the Cu base metal plates, it is desirable that the thickness of the Cu base metal plate is not more than 6 times the diameter of a hole to be formed, preferably not more than 3 times the diameter of the hole. The thickness of the Cu base metal plate is usually from 0.1 to 5 mm, especially from 0.5 to 2 mm.

A plurality of Cu base metal plates each having a plurality of holes are stacked in a supporting container so that the holes in one plate are aligned with the holes in another plate to form in the resulting stacked body through-holes to which bars or the like of a superconductor or a material convertible into a superconductor are to be inserted. The number of the plates to be stacked is not particularly limited, and it is usually selected from about 10 to about 1,000.

Examples of the material of the supporting container are, for instance, pure Cu; alloys of Cu as a base metal with at least one metal selected from the group consisting of Sn, Ga, Ti, In, Ge, Si and Al; materials which hardly reacts with Cu at a temperature not higher than the melting point of Cu, e.g., stainless steel and carbon; and other metals having a sufficient ductility. The supporting container may be removed in a step after preparing a composite billet, for example, by mechanically cutting the peripheral portion of the composite billet after extruding the billet to a smaller diameter. If a material which has a ductility not impairing the processings such as drawing and which is chemically removable without any substantial chemical reaction between the Cu base metal plate and a chemical used for the removal, is selected as the supporting container, the supporting container can be chemically removed with ease instead of subjecting an extruded composite billet to a step of cutting the both ends thereof and a step of cutting the peripheral portion thereof, whereby the process can be simplified with achievement of shortening of production time and reduction of production cost. As such a material there are used metals having a larger ionization tendency than Cu, e.g., Fe and Ni, and the supporting container made of these metals can be removed by an acid treatment. Hydrochloric acid and other inorganic acids are suitably selected and used for the acid treatment.

A material convertible into a superconductor by a heat treatment or a superconducting material is stuffed in the through-holes of the stacked body, for example, by inserting bars or rods made of these materials into the through-holes. The resultant is then evacuated and sealed, for example, by welding a cover to an open end thereof, to give a composite billet. Examples of the material convertible into a superconductor by a heat treatment are, for instance, pure Nb, pure V, an Nb or V base metal composed of Nb or V as a base metal and at least one member selected from the group consisting of Ti, Ta, Hf, Zr, W and Mo.

Superconducting wires are prepared from the thus prepared composite billet in a usual manner. In case of compound superconducting wires, after reducing the sectional area of the composite billet, for example, by extruding or drawing the billet, to an appropriate diameter, the composite billet is drilled, and a material capable of forming a superconductor with the above-mentioned convertible material, such as an Sn or Ga bar, is inserted into the resulting hole followed by further sectional area reduction processing to a final diameter.

A multi-module wire may be prepared by subjecting the composite billet according to the present invention to a sectional area reduction processing to a suitable diameter to give a single-module wire, stuffing a multiplicity of the thus obtained single-module wires into a Cu tube according to a conventional process or into holes of the stacked body prepared according to the present invention, and subjecting the resultant to a sectional area reduction processing. Extra fine multifilamentary superconducting wires can be obtained by repeating the above procedures and optionally heat-treating the multi-module wire having a final wire diameter.

The present invention is more specifically described and explained with reference to the following Examples and drawings.

EXAMPLE 1

NbTi alloy was subjected to cold working to give round bars having a diameter of 5.9 mm. Oxygen-free copper disks having a diameter of 159.8 mm and a thickness of 5 mm were pierced by an NC drilling machine to form 337 holes having a diameter of 6.0 mm at lattice points of a triangle lattice (lattice interval: 7.8 mm) within the region of 154 mm in diameter of each disk.

FIG. 1 is a plane view of the thus obtained oxygen-free copper disk as Cu base metal plate 1 having holes 2.

Sixty sheets of the disk were stacked in an oxygen-free copper supporting container having an outer diameter of 180 mm and an inner diameter of 160 mm to form a stacked body with their holes registered with each other. Into 337 holes of the resulting stacked body were inserted 337 round bars of NbTi alloy.

Figure 2:
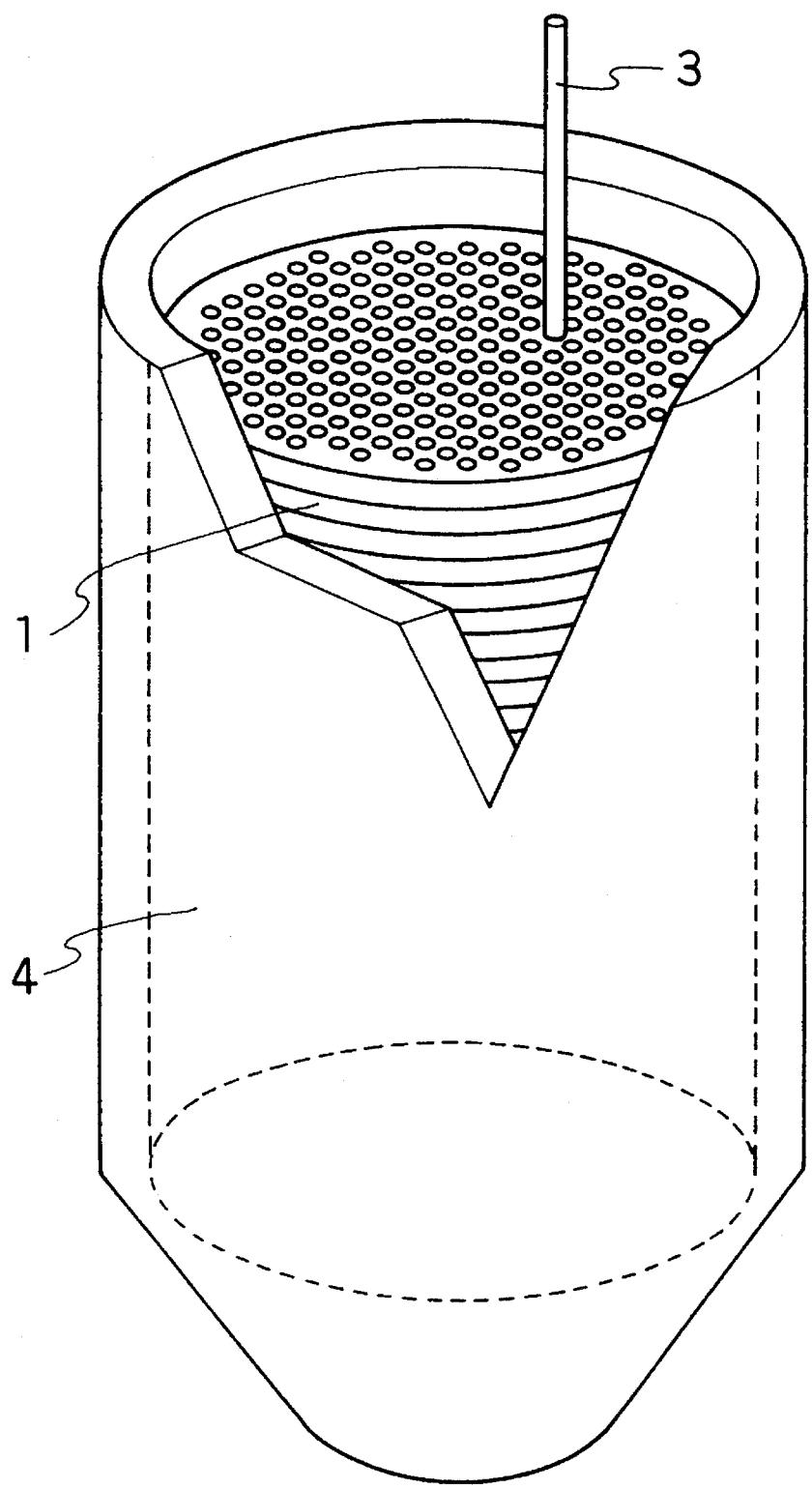
FIG. 2 is a partially cutaway perspective view showing the state that an NbTi bar is stuffed in one of holes of a stacked body composed of Cu base metal plates placed in a supporting container in an embodiment of the present invention.

FIG. 2 is a partially cutaway perspective view showing the state that an NbTi bar 3 is inserted into one of the holes of the stacked body of the plates 1 placed in the supporting container 4.

The container was then evacuated, and a cover was welded to an open end of the container to give a composite billet according to the present invention.

The insertion of NbTi bars into the holes of the stacked body composed of 60 oxygen-free copper disks was carried out with ease.

An NbTi superconducting wire can be prepared from the thus obtained composite billet by a conventional process.

Comparative Example 1

A composite billet was prepared according to a process as proposed in Japanese Patent Publication Kokoku No. 54-22758 as follows:

Round bars of NbTi alloy having a diameter of 5.0 mm and a length of 330 mm were prepared by cold working. Oxygen free copper columnar blocks having a diameter of 73 mm and a thickness of 30 mm were pierced to form 73 holes having a diameter of 3.5 mm in each block.

Eleven pieces of the block were stacked with their holes registered with each other, and 73 pieces of the NbTi round bar were inserted into the holes of the resulting stacked body to give a composite block. Oxygen-free copper top and bottom plates were put to both ends of the composite block, and the peripheral portions of the joints between the plate and the block and between the blocks were welded in a vacuum by electron beam welding to give a composite billet having a diameter of 73 mm and a length of 400 mm.

The composite billet was subjected to a hot extrusion processing and drawn to give an NbTi superconducting wire having a diameter of 0.52 mm.

In a repeated test, breaking of wire frequently occurred in the drawing step due to lack of strength in the weld portions between the copper blocks. Thus, it was found that the process as proposed in the above Japanese publication was not applicable to practical production of superconducting wires.

Comparative Example 2

Round bars of NbTi alloy was prepared by cold working. Each of the round bars was inserted in a Cu tube and drawn to give a single core wire having a hexagonal section having a side of 4.5 mm (volume fraction of NbTi: 53.7%). Then, 313 pieces of the thus prepared Cu/NbTi single core wire were stuffed in an oxygen-free copper container having an outer diameter of 180 mm and an inner diameter of 156 mm in a closest packing manner. In order to further raise the packing density, thin wires of oxygen-free copper were inserted into gaps formed between the stuffed single core wires and the Cu container. Air in the Cu container was evacuated, and a cover was welded to the container to give a composite billet.

EXAMPLE 2

By an NC drilling machine 246 holes having a diameter of 6.0 mm were drilled in each of oxygen-free copper disks having a diameter of 159.8 mm and a thickness of 5 mm at locations corresponding to lattice points of a triangle lattice having a lattice interval of 7.8 mm within the region between 79 mm and 154 mm in diameter of each disk.

Figure 3:
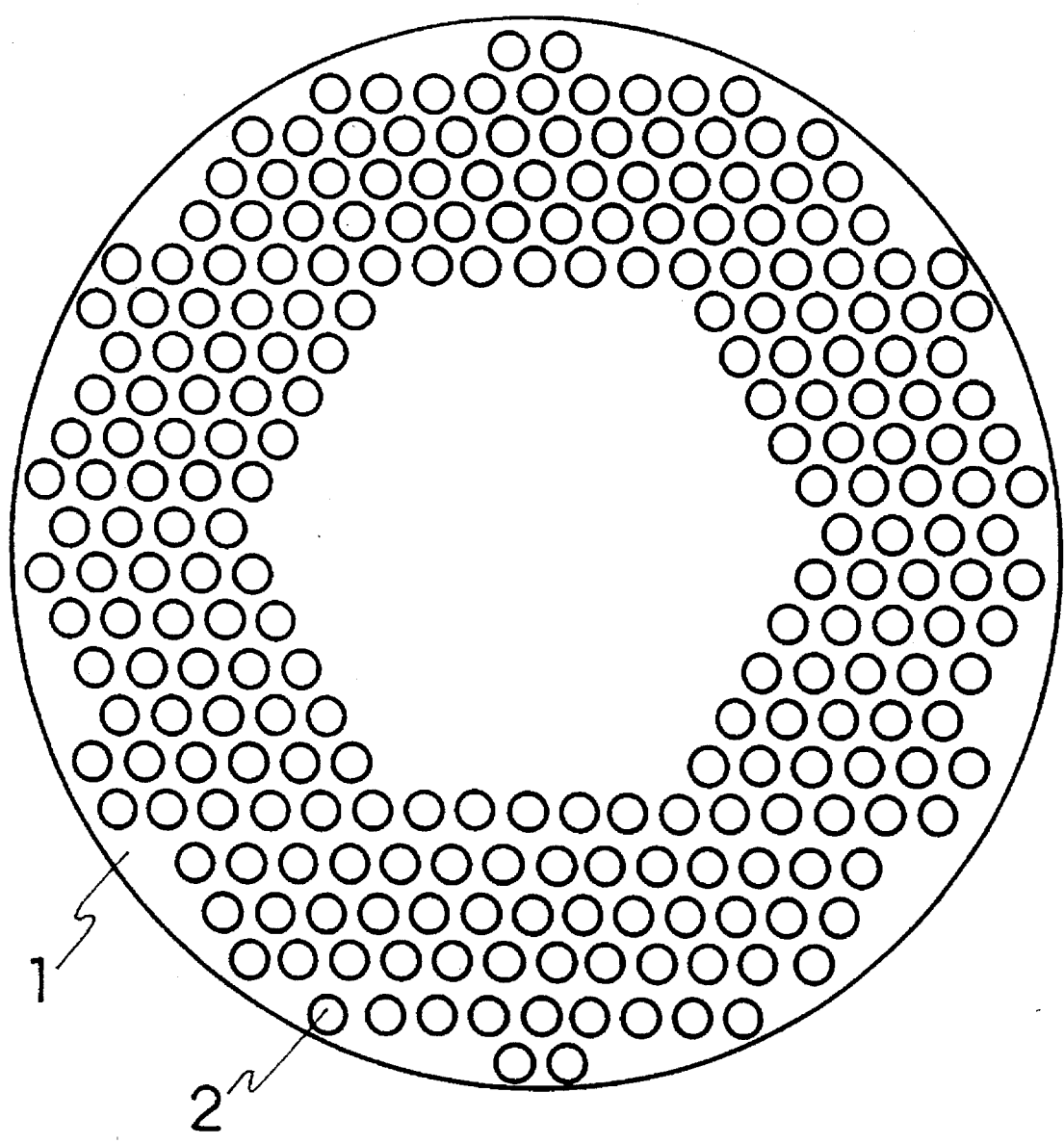
FIG. 3 is a plan view of a Cu base metal plate in which holes are drilled, related to another embodiment of the present invention.

FIG. 3 is a plan view showing the thus prepared Cu base metal plate 1 having holes 2.

Sixty sheets of the disk 1 were stacked in an oxygen-free copper supporting container having an outer diameter of 180 mm and an inner diameter of 160 mm so that the holes were aligned with each other to form a stacked body. Then, 246 Nb round bars having a diameter of 5.9 mm were inserted into the holes of the resulting stacked body. Air in the container was evacuated, and a cover was welded to the container to give a composite billet. The insertion of the Nb bars into the holes of the stacked copper disks was easy.

The thus obtained composite billet was extruded into a diameter of 50 min. The both ends of the drawn composite billet were cut off, and the peripheral portion thereof was also cut. A hole having a diameter of 19 mm was drilled in the central copper portion of the drawn composite billet, and thereto was inserted an Sn bar having a diameter of 18.8 min. The resultant was further drawn to a diameter of 9.8 mm to give a composite wire. After cleaning the surface of the composite wire, it was inserted into a Ta tube having an outer diameter of 11 mm and an inner diameter of 10 mm which served as a barrier against Sn diffusion and further into an oxygen-free copper tube having an outer diameter of 16 mm and an inner diameter of 11.2 mm which served as a stabilizing layer. The thus covered composite wire was drawn to a final wire diameter of 0.2 mm. The processability of the composite billet such as drilling and drawing was very good.

The obtained wire material was then heat-treated in a nitrogen atmosphere at a temperature of 600° to 750° C. for 30 to 200 hours to give an $Nb_3Sn$ superconducting wire.

The specifications of the wire material prior to the heat treatment are shown in Table 1.

Comparative Example 3

There were packed in a closest packing manner 91 pieces of an oxygen-free copper bar having a hexagonal section of 4.5 mm in a side in a center region of an oxygen-free copper container having an outer diameter of 180 mm and an inner diameter of 156 mm, and 222 pieces of a copper-covered Nb single core wire (volume fraction of Nb: 53.7%) having the same size as the copper bar around the copper bars packed. In order to raise the packing density, thin wires of oxygen-free copper were inserted into gaps. The container was evacuated and sealed by welding a cover thereto.

The thus obtained composite billet was subjected to extrusion processing to have a diameter of 50 mm. The both ends of the extruded billet were cut off, and the peripheral portion thereof was also cut. A hole having a diameter of 19 mm was drilled in the center copper portion of the extruded billet, and thereto was inserted an Sn bar having a diameter of 18.8 mm followed by drawing to a diameter of 9.8 mm to give a composite wire.

The composite wire was then processed in the same manner as in Example 2 to give a superconducting wire having a final wire diameter of 0.2 mm.

The specifications of the obtained wire material prior to heat treatment for converting into a superconducting wire are shown in Table 1.

EXAMPLE 3

Figure 4:
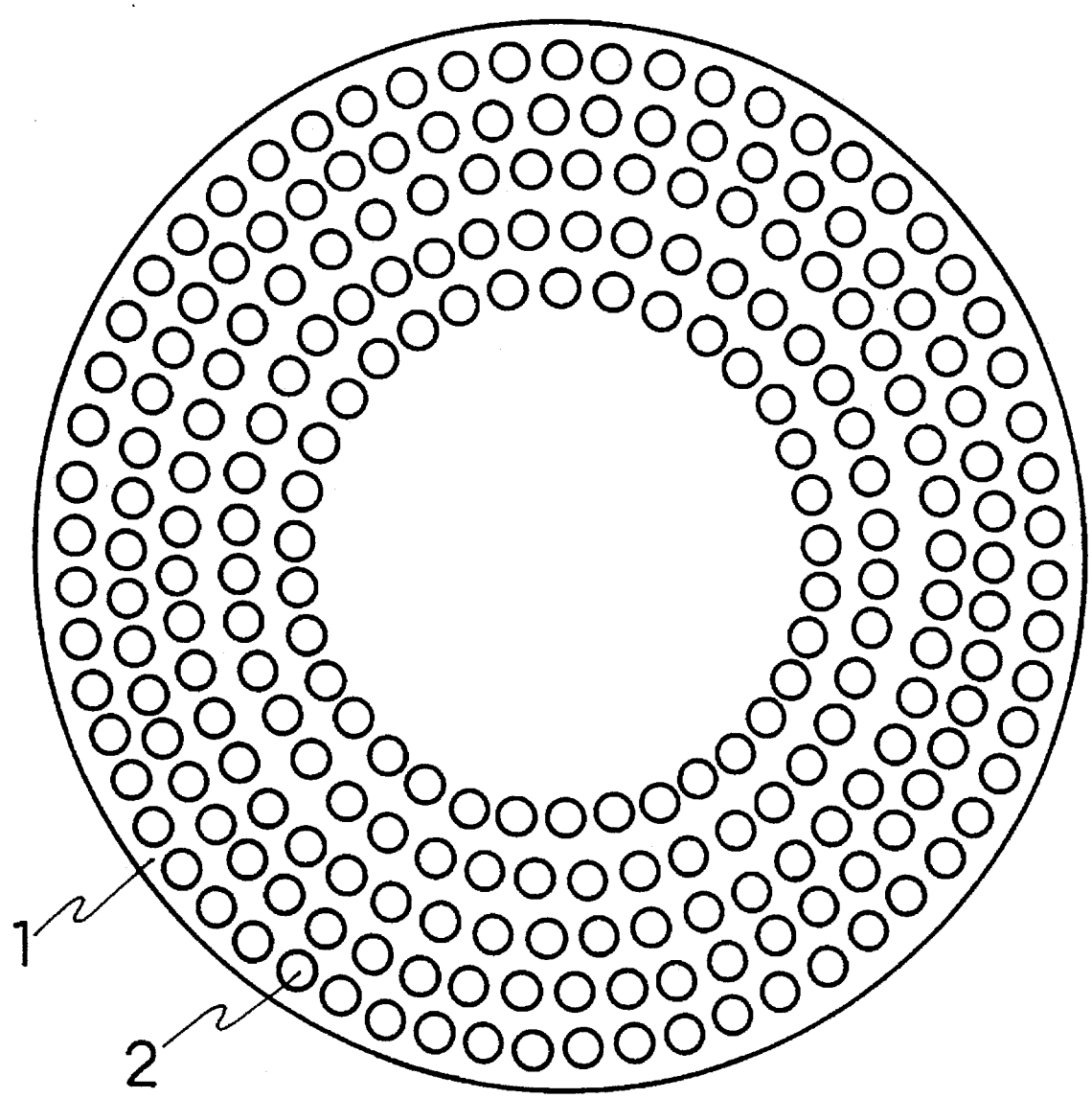
FIG. 4 is a plan view of a Cu base metal plate in which holes are drilled, related in a still another embodiment of the present invention.

By an NC drilling machine 232 holes having a diameter of 6.0 mm were drilled in a concentrical arrangement (average spacing between adjacent holes: 8.6 mm) in a region between 79 mm and 151 mm in diameter of each of oxygen-free copper disks having a diameter of 159.8 mm and a thickness of 5 mm. FIG. 4 is a plan view showing the thus prepared Cu disk 1 having a multiplicity of holes 2.

Sixty sheets of the disk 1 were stacked in an oxygen-free copper container having an outer diameter of 180 mm and an inner diameter of 160 mm so that the holes of the disks are aligned with each other to form a stacked body. Nb round bars having a diameter of 5.9 mm were inserted into 232 holes of the resulting stacked body in the container, and the container was evacuated, followed by welding a cover thereto, to give a composite billet. The insertion of Nb bars into the holes of the stacked copper disks was easy.

This composite billet was then processed in the same manner as in Example 2 to give an $Nb_3Sn$ superconducting wire having a final wire diameter of 0.2 mm.

The specifications of the wire material prior to heat treatment for converting into the superconducting wire are shown in Table 1.

TABLE 1

|  | Com. Ex. 3 | Ex. 2 | Ex. 3 |
| --- | --- | --- | --- |
| Outer diameter (mm) | 0.2 | 0.2 | 0.2 |
| Cu to non-Cu ratio | 1.1 | 1.1 | 1.1 |
| Nb volume fraction (%) | 26 | 29 | 28 |
| Nb filament diameter (μm) | 4.3 | 4.3 | 4.3 |
| Sn volume fraction (%) | 15.5 | 15.5 | 15.5 |
| Number of Nb filaments | 222 | 246 | 232 |

EXAMPLE 4

A composite billet was prepared in the same manner as in Example 3 by drilling 232 holes in each of oxygen-free copper disks having a diameter of 159.8 mm and a thickness of 5 mm, stuffing 60 disks in an oxygen-free copper container having an outer diameter of 180 mm and an inner diameter of 160 mm with their holes registered with each other, and inserting 232 Nb bars into the holes followed by evacuating and sealing the container.

The thus obtained composite billet was subjected to a hot isostatic pressing treatment (HIP treatment) under a pressure of 2 tons/cm² at 700° C. for 2 hours, whereby the outer diameter of the billet became 179 mm and the length of the billet was decreased by about 1 mm. The thus treated billet was then processed in the same manner as in Example 2 to give an $Nb_3Sn$ superconducting wire having a final wire diameter of 0.2 mm.

EXAMPLE 5

A composite billet was prepared in the same manner as in Example 3, excepting the use of a supporting container made of pure iron, by drilling 232 holes in each of oxygen-free copper disks having a diameter of 159.8 mm and a thickness of 5 mm, stuffing 60 disks in a container made of pure iron having an outer diameter of 180 mm and an inner diameter of 160 mm with their holes registered with each other, and inserting 232 Nb bars into the holes followed by evacuating and sealing the container.

The composite billet was subjected to a hot isostatic pressing treatment under a pressure of 2 tons/cm² at 700° C. for 2 hours, and was then extruded to have a diameter of 50 mm.

The extruded billet was immersed in 1N-HCl to dissolve the peripheral pure iron container portion. The dissolution of the peripheral pure iron layer could be conducted with very ease.

The thus treated billet was then processed in the same manner as in Example 2 by drilling a hole in a central copper portion, inserting an Sn bar into the hole, drawing and covering the resultant with a Ta tube and an oxygen-free copper tube, further drawing to a final wire diameter of 0.2 mm, and heat-treating the resulting wire material to give an Nb₃Sn superconducting wire. The specifications of the wire material prior to the heat treatment were approximately the same as those of the wire material obtained in Example 3.

EXAMPLE 6

The procedure of Example 4 was repeated to give an Nb₃Sn superconducting wire having a diameter of 0.2 mm except that oxygen-free copper disks having a thickness of 1 mm were pierced by punching to form 232 holes having a diameter of 6.0 mm in each disk and 300 disks were stacked in the container.

A step of preparing copper-covered Nb or NbTi single core wires and a step of stuffing oxygen-free copper fine wires in gaps formed between the stuffed single core wires and a container in order to raise the packing density, which have been required in a conventional process, have been able to be omitted by adopting a step of inserting Nb or NbTi bars into holes of a plurality of oxygen-free copper disks stacked in an oxygen-free copper container as a method for preparing a composite billet, as shown in Examples 1 and 2, instead of a conventionally adopted step of inserting a multiplicity of the single core wires into the oxygen-free copper container. Thus, the process steps have been able to be considerably simplified, whereby the preparation time can be shortened and the preparation cost can be reduced.

Further, as shown in Examples 4 to 6, a hot isostatic pressing treatment such as HIP treatment of an evacuated and sealed composite billet would improve the adhesion between the oxygen-free copper container, the oxygen-free copper disks stacked (a stacked body) and the Nb bars and, therefore, the processability in the following section reducing processing is further improved. That is to say, the degree of processing for the section reducing processing of composite billet can be selected from a wider range, and also the rate of wire breaking during the processing is decreased to approximately zero to improve the yield while the preparation time is shortened. Thus, the preparation cost can be further reduced. The hot isostatic pressing treatment step is of course effective also for the process of the preparation of superconducting wires wherein superconductor bars are used instead of Nb bars.

When the supporting container can be chemically removed without causing any chemical reaction of the Cu base metal plates from a composite billet subjected to an extrusion processing for increasing the current density of wire materials, as shown in Example 5, instead of cutting the both ends of the extruded composite billet and cutting the peripheral layer of extruded composite billet derived from the container, the process can be further simplified, thus the preparation time is further shortened and the preparation cost is further reduced. The pure iron layer of the composite billet prepared in Example 5 by using a pure iron container as the supporting container could be easily removed without impairing oxygen-free copper disks stacked in the container by immersing the composite billet in hydrochloric acid after extruding it to thereby dissolve the peripheral iron layer. It is needless to say that this chemical treatment to remove the outer layer of extruded composite billet derived from the supporting container is advantageous regardless of subjecting the composite billet to a hot isostatic pressing treatment. Further, this chemical treatment step is of course also effective for the process of the preparation of using superconducting wires bars of a superconductor instead of Nb bars.

In the above Examples, Nb or NbTi in the form of a round bar is embedded in a Cu base matrix in the composite billet.

Therefore, as mentioned after, when superconducting wires are prepared using such a composite billet, a possible change in sectional shape of Nb or NbTi filaments owing to the section reducing processing can be minimized to prevent deformation of the filaments owing to the section reducing processing as encountered in a conventional process. Thus, in case that the volume fraction of the filaments is the same as that of a conventional wire, the effective spacing between the produced superconducting filaments is made wider than that of a conventional one, resulting in decrease of AC loss, typically hysteresis loss.

Further, since the shape and distribution pattern of the holes to be formed in Cu base metal plates such as oxygen-free copper disks can be arbitrarily set in the process of the present invention, for example, as shown in Example 3, the degree of freedom in design of composite billet is greatly increased. As mentioned after, when superconducting wires are prepared using the composite billet according to the present invention, it is possible to widen the effective spacing between the produced superconducting filaments by applying an optimum design to the sectional structure, thereby producing such an effect as AC loss reduction, typically hysteresis loss reduction.

In comparison between Example 2 and Comparative Example 3, it is found that superconducting wires can be obtained from the composite billet according to the present invention by applying thereto the same processings as those applied to conventional composite billets.

Figure 5:
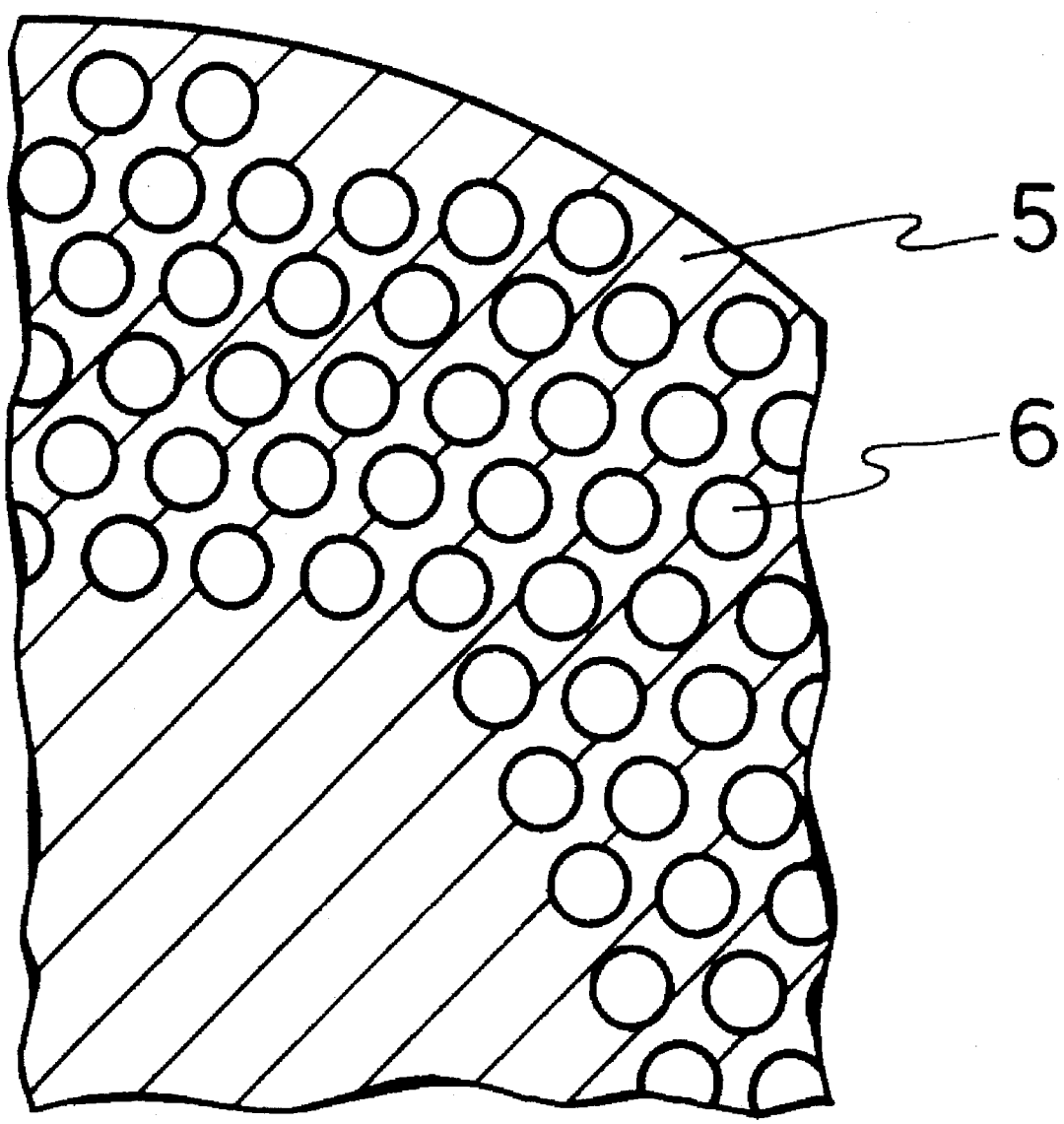
FIG. 5 is a partial sectional view of an $Nb_3Sn$ superconducting wire obtained in Example 2 according to the present invention.
Figure 6:
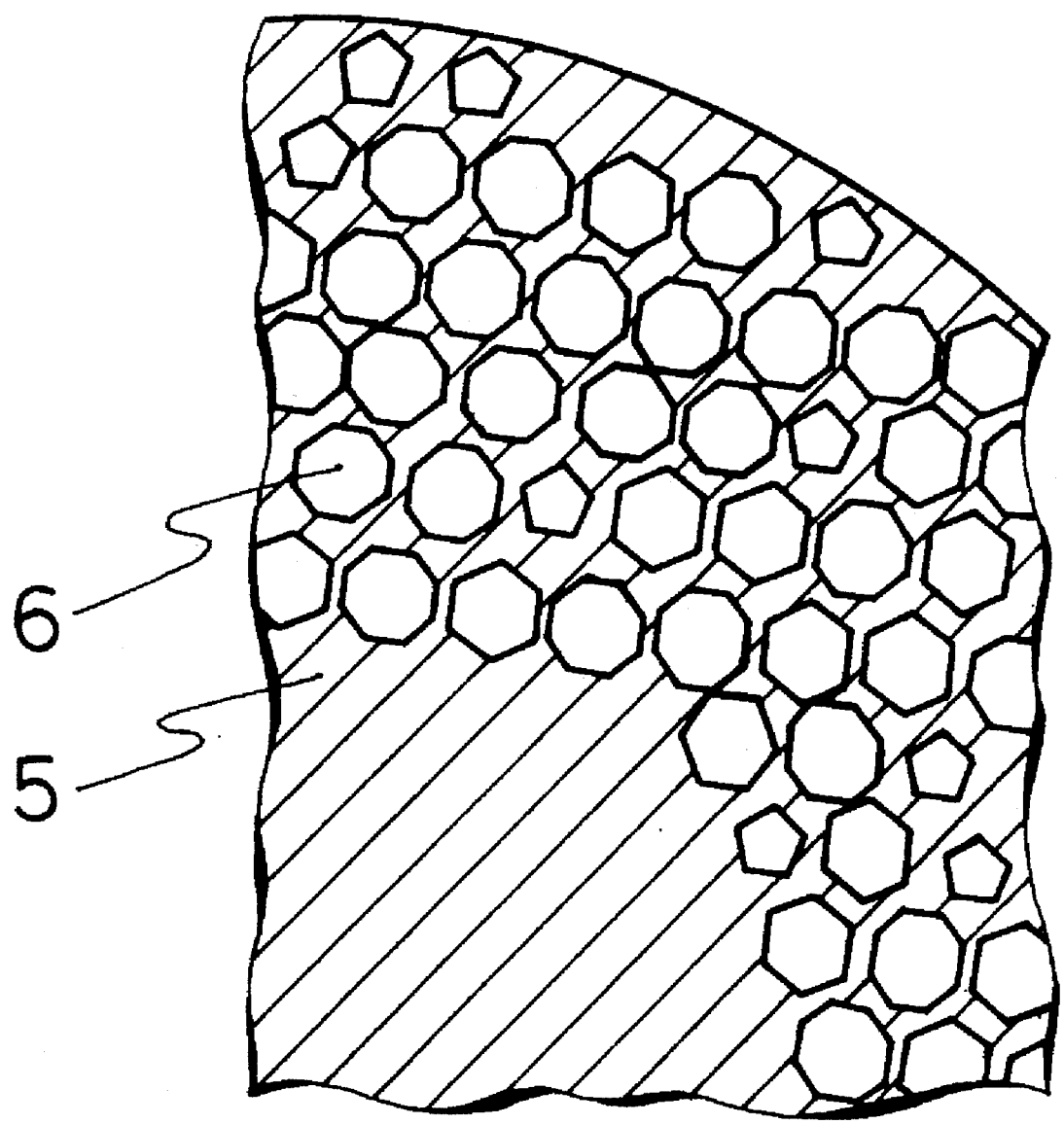
FIG. 6 is a partial sectional view of an $Nb_3Sn$ superconducting wire obtained in Comparative Example 2 according to a conventional process.

FIGS. 5 and 6 are partial sectional views of the Nb₃Sn superconducting wires obtained in Example 2 and Comparative Example 3, respectively, wherein numeral 5 is a Cu matrix and numeral 6 is Nb₃Sn filaments. It is found from these figures that change in sectional shape of Nb₃Sn filaments owing to the section reducing processing is minimized in the wire obtained in Example 2, whereas the Nb₃Sn filaments are subject to large deformation by the section reducing processing in the wire obtained in Comparative Example 3 according to a conventional process.

In general, if the wire diameter of superconducting wires is decreased, not only the distance between adjacent superconducting filaments becomes very small, but also deformation occurs in sectional shape of the filaments owing to the processing as mentioned above. As a result, physical coupling of the filaments or superconductive coupling of the filaments based on a proximity effect occurs in a part or most of the superconducting filaments, so the effective filament diameter required from the viewpoint of electric characteristics of superconducting wires becomes larger than actual filament diameter to raise a problem that AC loss, typically hysteresis loss, is increased.

The results of measurement of average filament diameter, average spacing between filaments and effective filament diameter of the superconducting wires obtained in Examples 2 and 3 and Comparative Example 3 are shown in Table 2.

TABLE 2

|  | Com. Ex. 3 | Ex. 2 | Ex. 3 |
| --- | --- | --- | --- |
| Average filament diameter (μm) | 4.3 | 4.3 | 4.3 |
| Average filament spacing (μm) | 1.3 | 1.3 | 1.9 |
| Effective filament diameter (μm) | 12.0 | 7.0 | 5.0 |

It is observed in Table 2 that the average spacing between the Nb₃Sn filaments in the superconducting wire obtained in Example 3 designed a concentrical arrangement is much larger than that in the superconducting wire prepared in Comparative Example 3 according to a conventional arrangement.

As shown in Table 2, the effective filament diameter could be reduced to about 58% in Example 2 and about 42% in Example 3, respectively, based on the effective filament diameter of the wire in Comparative Example 3 according to a conventional process. These results would be based on the fact that in case of Example 2, round bars of Nb were embedded in the Cu base metal matrix in the composite billet, whereby change in sectional shape of the resulting Nb filaments owing to the processing could be minimized, as shown in FIG. 5, and the fact that in addition to the minimized sectional shape change, the composite billet of Example 3 was designed to have an optimum structure, in other words, holes to be stuffed with Nb round bars were suitably formed so as to provide a large critical current and to reduce an AC loss, typically hysteresis loss. As a result, marked reduction of AC loss has been achieved in these Examples as compared with Comparative Example 3. Further, the dependency on magnetic field of critical current at 4.2K were measured with respect to three kinds of superconducting wires obtained in Examples 2 and 3 and Comparative Example 3, and no significant difference was observed therebetween. Also, substantially the same results as above are obtained between the NbTi superconducting wires of Example 1 and Comparative Example 2.

In the above Examples, $Nb_3Sn$ superconducting wires were prepared by an internal tin diffusion method using the composite billets according to the present invention, but it is of course possible to prepare $Nb_3Sn$ or $V_3Ga$ superconducting wires by other known methods.

What we claim is:

1. A process for preparing a superconducting wire which comprises the steps of making a plurality of holes in each of Cu base metal plates, placing said plates in a supporting container in a stacked fashion so that the holes in said plates are aligned with each other to form through-holes in the resulting stacked body, stuffing a material convertible into a superconductor by a heat treatment into said through-holes of the stacked body, evacuating and sealing said supporting container to form a composite billet, processing said composite billet to reduce its sectional area to a wire, and heat-treating said wire to convert said convertible material into a superconductor.

2. The process of claim 1, wherein said composite billet is subjected to a hot isostatic pressing treatment prior to processing to reduce its sectional area.

3. The process of claim 1, wherein said composite billet is processed to reduce its sectional area and is subjected to a chemical treatment to remove its peripheral layer derived from said supporting container without causing any substantial chemical reaction with said Cu base metal plates followed by processing to reduce its sectional area to a final wire diameter.

4. The process of claim 3, wherein said supporting container is made of Fe or Ni and said chemical treatment is carried out by immersing said composite billet in an acid.

5. The process of claim 4, wherein said acid is hydrochloric acid.

6. The process of claim 1, wherein each of said Cu base metal plates has a thickness of not more than 6 times the diameter of said holes made therein.

7. A process for preparing a superconducting wire which comprises the steps of making a plurality of holes in each of Cu base metal plates, placing said plates in a supporting container in a stacked fashion so that the holes in said plates are aligned with each other to form through-holes in the resulting stacked body, stuffing a material convertible into a superconductor by a heat treatment into said through-holes of the stacked body, evacuating and sealing said supporting container to form a composite billet, subjecting said composite billet to a hot isostatic pressing treatment, processing the composite billet to reduce its sectional area, subjecting the processed composite billet to a chemical treatment to remove its peripheral layer derived from said supporting container without causing any substantial chemical reaction with said Cu base metal plates, processing the chemically treated composite billet to reduce its sectional area to form a wire material having a final wire diameter, and heat-treating said wire material to convert said convertible material into a superconductor.

8. The process of claim 7, wherein said supporting container is made of Fe or Ni and said chemical treatment is carried out by immersing said composite billet in an acid.

9. The process of claim 8, wherein said acid is hydrochloric acid.

10. The process of claim 7, wherein each of said Cu base metal plates has a thickness of not more than 6 times the diameter of said holes made therein.

11. A process for preparing a superconducting wire which comprises the steps of making a plurality of holes in each of Cu base metal plates, placing said plates in a supporting container in a stacked fashion so that the holes in said plates are aligned with each other to form through-holes in the resulting stacked body, stuffing a superconducting material into said through-holes of the stacked body, evacuating and sealing said supporting container to form a composite billet, processing said composite billet to reduce its sectional area to form a wire material having a final wire diameter, and heat-treating said wire material.

12. The process of claim 11, wherein said composite billet is subjected to a hot isostatic pressing treatment prior to processing to reduce its sectional area.

13. The process of claim 11, wherein said composite billet is processed to reduce its sectional area and is subjected to a chemical treatment to remove its peripheral layer derived from said supporting container without causing any substantial chemical reaction with said Cu base metal plates followed by processing to reduce its sectional area to a final wire diameter.

14. The process of claim 13, wherein said supporting container is made of Fe or Ni and said chemical treatment is carried out by immersing said composite billet in an acid.

15. The process of claim 14, wherein said acid is hydrochloric acid.

16. The process of claim 11, wherein each of said Cu base metal plates has a thickness of not more than 6 times the diameter of said holes made therein.

17. A process for preparing a superconducting wire which comprises the steps of making a plurality of holes in each of Cu base metal plates, placing said plates in a supporting container in a stacked fashion so that the holes in said plates are aligned with each other to form through-holes in the resulting stacked body, stuffing a superconducting material into said through-holes of the stacked- body, evacuating and sealing said supporting container to form a composite billet, subjecting said composite billet to a hot isostatic pressing treatment, processing the composite billet to reduce its sectional area, subjecting the processed composite billet to a chemical treatment to remove its peripheral layer derived from said supporting container without causing any substantial chemical reaction with said Cu base metal plates, and processing the chemically treated composite billet to reduce its sectional area to form a wire material having a final wire diameter, and heat-treating said wire material.

18. The process of claim 17, wherein said supporting container is made of Fe or Ni and said chemical treatment is carried out by immersing said composite billet in an acid.

19. The process of claim 18, wherein said acid is hydrochloric acid.

20. The process of claim 17, wherein each of said Cu base metal plates has a thickness of not more than 6 times the diameter of said holes made therein.

* * * * *

UNITED STATES PATENT AND TRADEMARK OFFICE
CERTIFICATE OF CORRECTION

PATENT NO. : 5,501,746

DATED : March 26, 1996

INVENTOR(S) : Kunihiko EGAWA et al

It is certified that error appears in the above-indentified patent and that said Letters Patent is hereby corrected as shown below:

In Column 9, line 5, delete "min." and insert -- mm. --.

In Column 9, line 10, delete "min." and insert -- mm. --.

Signed and Sealed this

Third Day of September, 1996

Attest:

BRUCE LEHMAN

*Attesting Officer*     *Commissioner of Patents and Trademarks*